United States Patent
Chida

(10) Patent No.: US 10,655,216 B2
(45) Date of Patent: May 19, 2020

(54) PRESSURE CONTROL METHOD

(71) Applicant: TOKYO ELECTRON LIMITED, Tokyo (JP)

(72) Inventor: Yuki Chida, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 58 days.

(21) Appl. No.: 15/897,799

(22) Filed: Feb. 15, 2018

(65) Prior Publication Data

US 2018/0237905 A1 Aug. 23, 2018

(30) Foreign Application Priority Data

Feb. 20, 2017 (JP) ................................. 2017-029377

(51) Int. Cl.
| | |
|---|---|
| *C23C 16/455* | (2006.01) |
| *C23C 14/56* | (2006.01) |
| *C23C 14/24* | (2006.01) |

(52) U.S. Cl.
CPC ............ *C23C 14/56* (2013.01); *C23C 14/246* (2013.01); *C23C 16/45551* (2013.01); *C23C 16/45557* (2013.01)

(58) Field of Classification Search
CPC ................. C23C 16/45551; C23C 16/45557
See application file for complete search history.

(56) References Cited

U.S. PATENT DOCUMENTS

2010/0055297 A1* 3/2010 Kato ................. C23C 16/45551
427/8
2011/0100489 A1* 5/2011 Orito ................. C23C 16/45502
137/560

FOREIGN PATENT DOCUMENTS

| JP | 20080-118120 A | 5/2008 |
| JP | 2010-80924 A | 4/2010 |
| JP | 2011-100786 A | 5/2011 |

* cited by examiner

*Primary Examiner* — Elizabeth A Burkhart
(74) *Attorney, Agent, or Firm* — Nath, Goldberg & Meyer; Jerald L. Meyer

(57) ABSTRACT

A pressure control method in a film forming apparatus having a plurality of incompletely partitioned processing regions in one vacuum container, includes a first adjustment step of adjusting an opening degree of an exhaust valve provided in each of the processing regions, on the basis of a target pressure and a target flow rate determined for each of the processing regions and learning information indicating a relationship between a flow rate, a pressure and an opening degree, and a second adjustment step of, after the first adjustment step, adjusting an opening degree of an exhaust valve provided in one of the processing regions, on the basis of a pressure in one of the processing regions.

8 Claims, 11 Drawing Sheets

PRESSURE CONTROL METHOD

CROSS-REFERENCE TO RELATED APPLICATION

This application is based upon and claims the benefit of priority from Japanese Patent Application No. 2017-029377, filed on Feb. 20, 2017, the entire contents of which are incorporated herein by reference.

TECHNICAL FIELD

The present disclosure relates to a pressure control method.

BACKGROUND

There is a film forming apparatus having two processing regions provided inside one vacuum container and being incompletely partitioned by a separation region to which a separation gas is supplied. In this film forming apparatus, different reaction gases are supplied to the two processing regions, respectively.

Incidentally, in the case where the two processing regions are incompletely partitioned, when the pressure in the vacuum container or the flow rate of the reaction gases are suddenly changed, the reaction gases may flow out from one processing region to the other and may be mixed in some cases.

Thus, in the related art, exhaust paths are provided individually in respective processing regions, and a separation region is provided between the processing regions. The ratio of flow rates of gases to be exhausted from the exhaust paths and the pressure inside a vacuum container are adjusted so that the gas flow toward a substrate becomes constant.

However, in the above technique, the adjustment of the gas flow rate ratio and the adjustment of the pressure inside the vacuum container are alternately repeated when changing conditions including a pressure. Therefore, the adjustment is time-consuming, and there is room for improvement from the viewpoint of productivity.

SUMMARY

Some embodiments of the present disclosure provide a pressure control method capable of improving productivity.

According to one embodiment of the present disclosure, there is provided a pressure control method in a film forming apparatus having a plurality of incompletely partitioned processing regions in one vacuum container, including a first adjustment step of adjusting an opening degree of an exhaust valve provided in each of the processing regions, on the basis of a target pressure and a target flow rate determined for each of the processing regions and learning information indicating a relationship between a flow rate, a pressure and an opening degree, and a second adjustment step of, after the first adjustment step, adjusting an opening degree of an exhaust valve provided in one of the processing regions, on the basis of a pressure in one of the processing regions.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
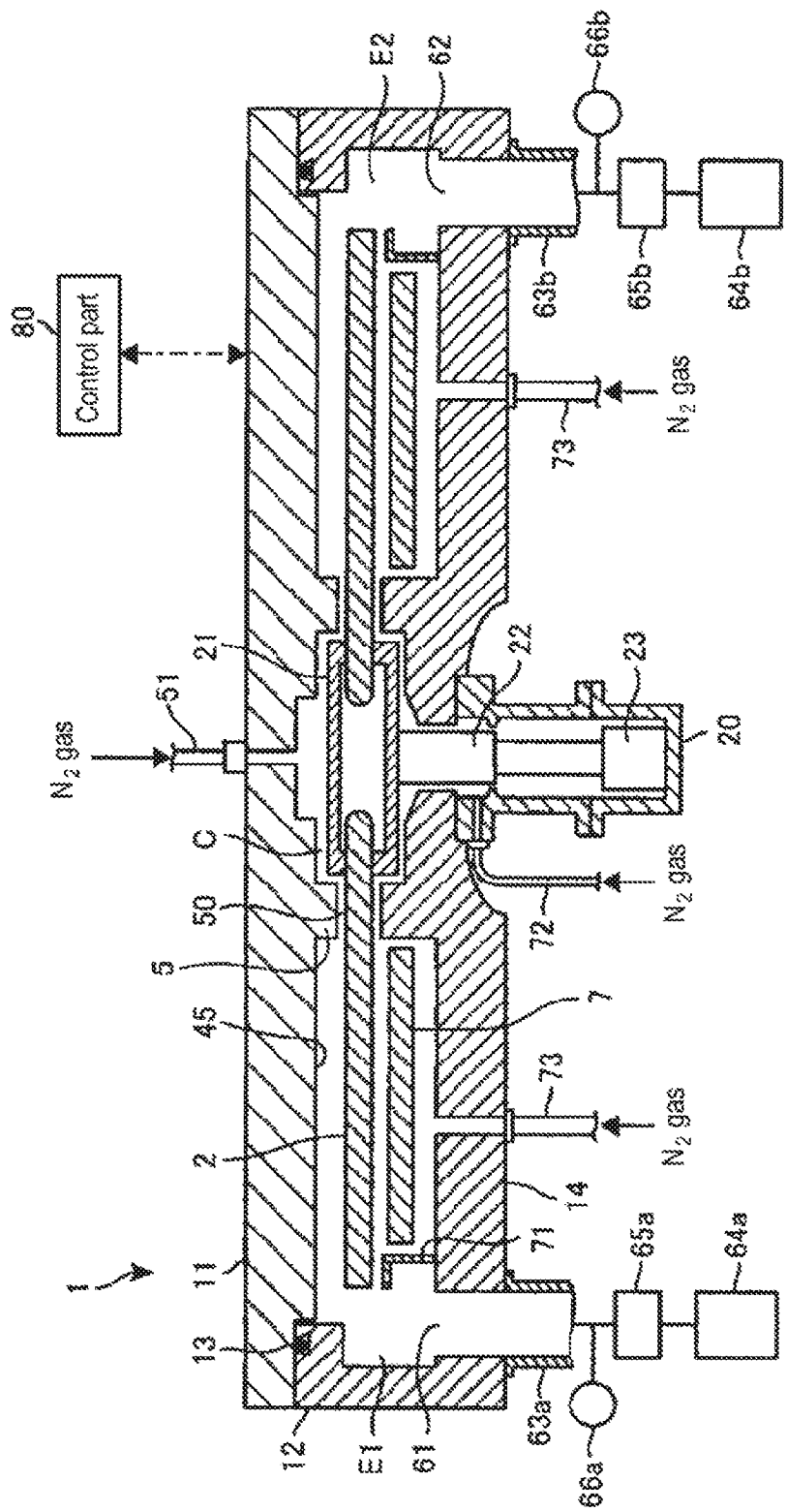
FIG. 1 is a vertical sectional view of a film forming apparatus according to a first embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, modes for carrying out the present disclosure will be described with reference to the drawings. In the specification and the drawings, substantially the same components are denoted by the same reference numerals, and redundant descriptions thereof are omitted.

A pressure control method according to an embodiment of the present disclosure is a pressure control method for a film forming apparatus having a plurality of processing regions incompletely partitioned in one vacuum container. In the pressure control method according to the embodiment of the present disclosure, when changing conditions accompanying a pressure change, it is possible to prevent a reaction gas from flowing out from one processing region to another processing region and to change the conditions in a short time. As a result, it is possible to improve productivity.

Hereinafter, the pressure control method according to the embodiment of the present disclosure will be described by taking the film forming apparatuses according to first to fourth embodiments as an example.

First Embodiment

Figure 2:
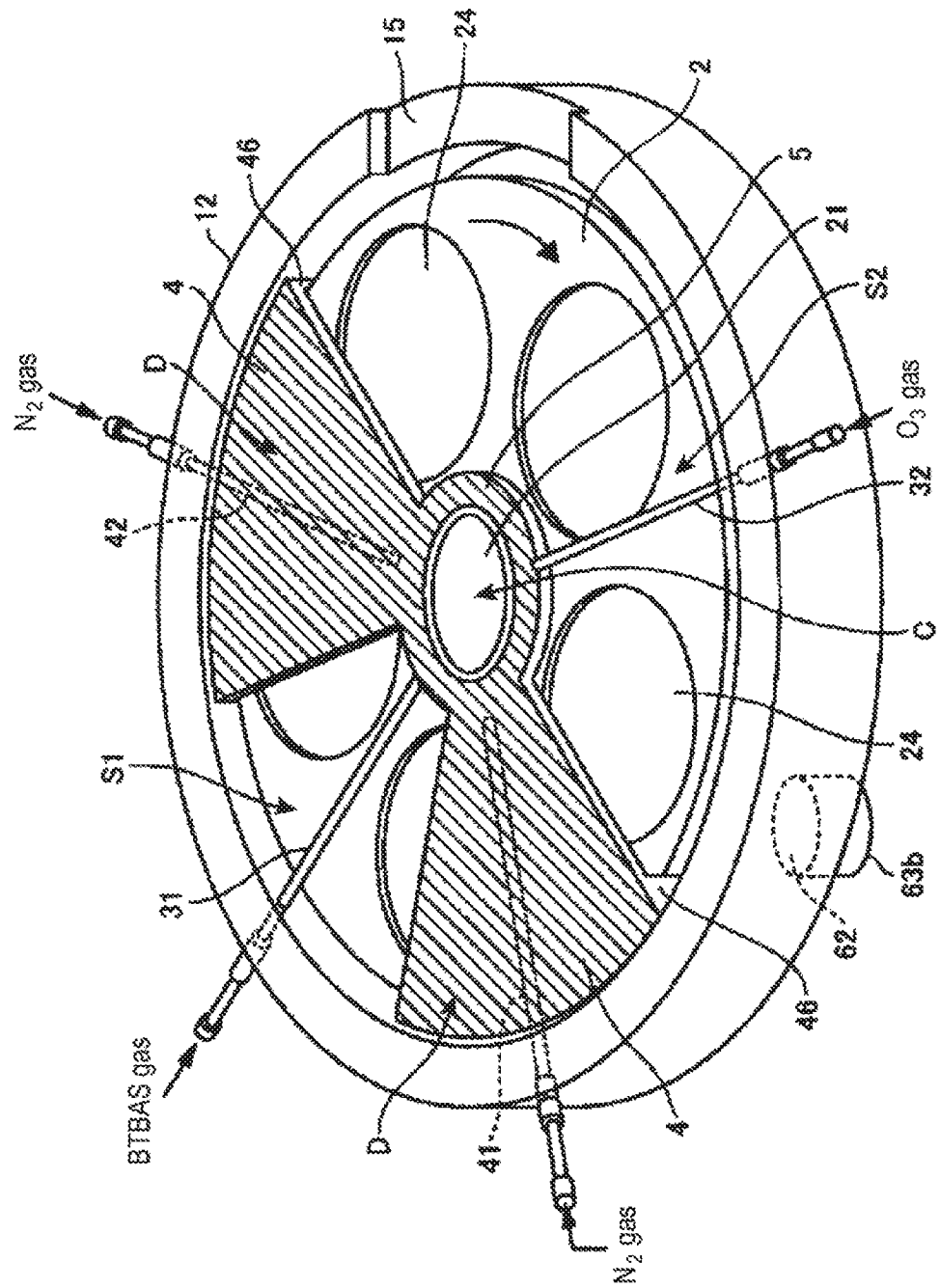
FIG. 2 is a perspective view showing a schematic internal configuration of the film forming apparatus of FIG. 1.
Figure 3:
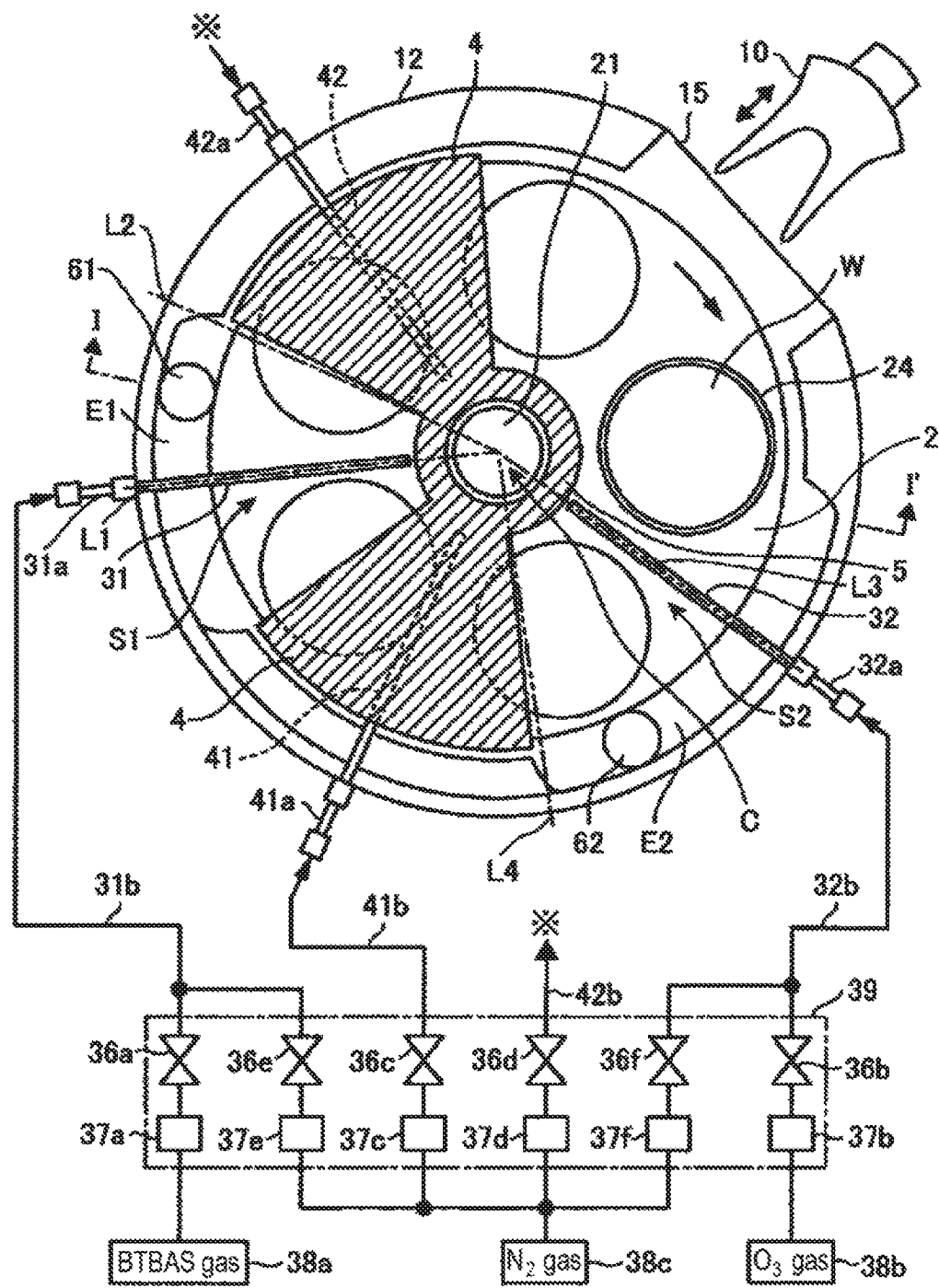
FIG. 3 is a horizontal sectional plan view of the film forming apparatus of FIG. 1.

FIG. 1 is a vertical sectional view of a film forming apparatus according to a first embodiment, which is taken along line I-I' in FIG. 3. FIG. 2 is a perspective view showing a schematic internal configuration of the film formation apparatus of FIG. 1. FIG. 3 is a horizontal sectional plan view of the film forming apparatus of FIG. 1.

As shown in FIGS. 1 to 3, the film forming apparatus includes a flat vacuum container 1 having a substantially circular plan-view shape, and a rotary table 2 provided inside the vacuum container 1 and having a rotation center at the center of the vacuum container 1.

The vacuum container 1 is configured so that a top plate 11 can be detached from a container body 12. As the interior of the vacuum container 1 is depressurized, the top plate 11 is pressed against the container body 12 via a sealing member, for example, an O-ring 13 provided in a ring shape in the peripheral edge portion of the upper surface of the container body 12, thereby maintaining an airtight state. When detached from the container body 12, the top plate 11 is lifted upward by a driving mechanism (not shown).

The rotary table 2 is fixed to a cylindrical core portion 21 at the central portion thereof. The core portion 21 is fixed to the upper end of a rotary shaft 22 extending in the vertical direction. The rotary shaft 22 penetrates a bottom surface portion 14 of the vacuum container 1. The lower end of the rotary shaft 22 is attached to a driving part 23 which rotates the rotary shaft 22 about a vertical axis, for example, clockwise. The rotary shaft 22 and the driving part 23 are accommodated in a tubular case body 20 whose top surface is opened. A flange portion provided on the upper surface of the case body 20 is airtightly attached to the lower surface of the bottom surface portion 14 of the vacuum container 1, thereby maintaining an airtight state between the internal atmosphere of the case body 20 and the external atmosphere.

On the surface portion of the rotary table 2, as shown in FIGS. 2 and 3, circular recesses 24 for mounting a plurality of, for example, five, semiconductor wafers (hereinafter referred to as "wafers W"), which are substrates, are provided along the rotation direction (circumferential direction). The recesses 24 are used for positioning the wafers W so as not to jump out due to the centrifugal force generated by the rotation of the rotary table 2. In FIG. 3, the wafer W mounted only in one of the recesses 24 is shown for the sake of convenience.

Figure 4A:
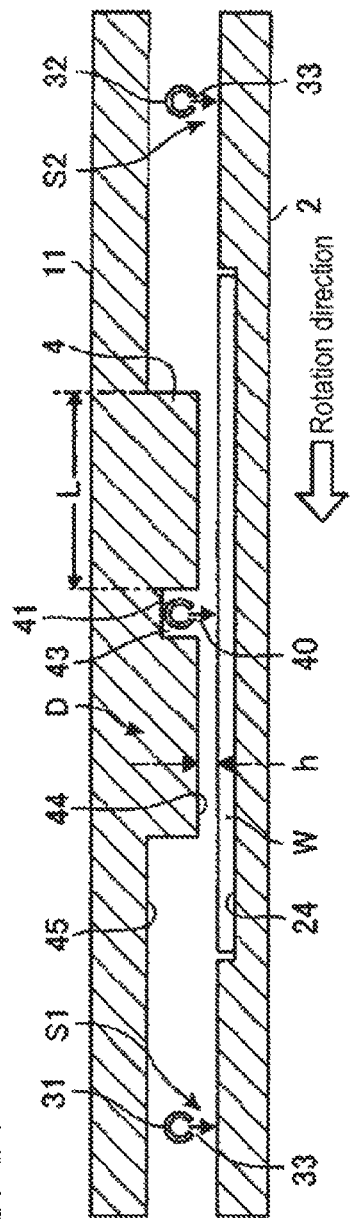
FIGS. 4A and 4B are vertical sectional views showing processing regions and a separation region in the film forming apparatus of FIG. 1.
Figure 4B:
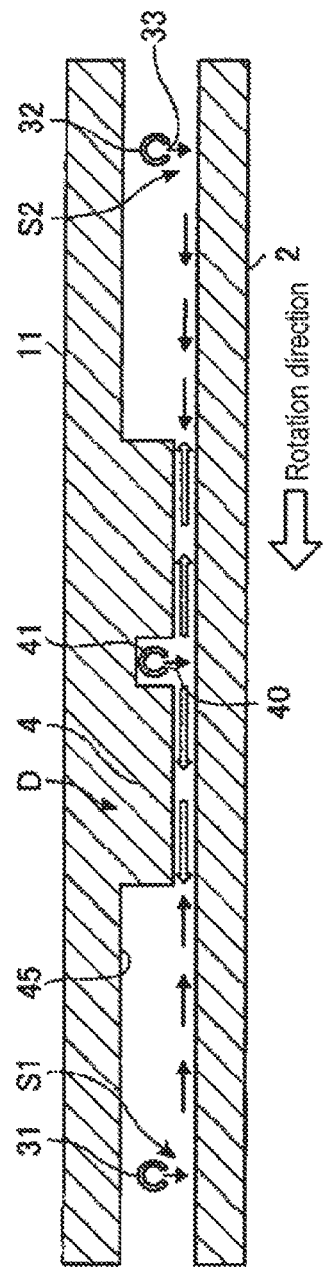

FIGS. 4A and 4B are developed views showing the rotary table 2 which is cut along a concentric circle and developed laterally. As shown in FIG. 4A, the diameter of the recess 24 is set to be slightly, for example, 4 mm, larger than the diameter of the wafer W, and the depth of the recess 24 is set to be equal to the thickness of the wafer W. Therefore, when the wafer W is mounted in the recess 24, the surface of the wafer W is flush with the surface of the rotary table 2 (the region where the wafer W is not mounted). If the difference in height between the surface of the wafer W and the surface of the rotary table 2 is large, pressure fluctuations occur at the step portion. Therefore, from the viewpoint of improving the in-plane uniformity of film thickness, it is prudent to equalize the heights of the surface of the wafer W and the surface of the rotary table 2. Equalizing the heights of the surface of the wafer W and the surface of the rotary table 2 means that the surface of the wafer W and the surface of the rotary table 2 have the same height, or that the difference between the surface of the wafer W and the surface of the rotary table 2 is 5 mm or less. However, depending on the processing accuracy or the like, it is prudent to make the height difference between the surface of the wafer W and the surface of the rotary table 2 close to zero. Through-holes (not shown) for engagement with, for example, three lift pins (not shown) for supporting the rear surface of the wafer W and vertically moving the wafer W are formed on the bottom surface of the recess 24.

As shown in FIGS. 2 and 3, in the vacuum container 1, at the upper positions facing the passage regions of the recess 24 in the rotary table 2, a first reaction gas nozzle 31, a second reaction gas nozzle 32 and two separation gas nozzles 41 and 42 are provided at intervals in the circumferential direction of the vacuum container 1 (the rotation direction of the rotary table 2) so as to radially extend from the central portion. In this example, the second reaction gas nozzle 32, the separation gas nozzle 41, the first reaction gas nozzle 31 and the separation gas nozzle 42 are arranged in the named order in the clockwise direction. The first reaction gas nozzle 31, the second reaction gas nozzle 32 and the separation gas nozzles 41 and 42 are attached to, for example, the side peripheral wall of the vacuum container 1. Gas introduction ports 31a, 32a, 41a and 42a, which are the base end portions of the first reaction gas nozzle 31, the second reaction gas nozzle 32 and the separation gas nozzles 41 and 42, are embedded in the side peripheral wall of the vacuum container 1.

The first reaction gas nozzle 31 is connected to a first gas supply source 38a storing a BTBAS (bis(tertiary-butylamino)silane) gas, which is a first reaction gas, via a gas supply pipe 31b on which a valve 36a and a flow rate adjustment part 37a are located.

The second reaction gas nozzle 32 is connected to a second gas supply source 38b for storing an $O_3$ (ozone) gas, which is a second reaction gas, via a gas supply pipe 32b on which a valve 36b and a flow rate adjustment part 37b are located.

The separation gas nozzle 41 is connected to an $N_2$ gas supply source 38c for storing an $N_2$ (nitrogen) gas, which is a separation gas and an inert gas, via a gas supply pipe 41b on which a valve 36c and a flow rate adjustment part 37c are located.

The separation gas nozzle 42 is connected to an $N_2$ gas supply source 38c via a gas supply pipe 42b on which a valve 36d and a flow rate adjustment part 37d are located.

The $N_2$ gas supply source 38c is connected to the gas supply pipe 31b between the first reaction gas nozzle 31 and the valve 36a via a valve 36e and a flow rate adjustment part 37e. The $N_2$ gas can be supplied from the first reaction gas nozzle 31 into the vacuum container 1.

The $N_2$ gas supply source 38c is connected to the gas supply pipe 32b between the second reaction gas nozzle 32 and the valve 36b via a valve 36f and a flow rate adjustment part 37f. The $N_2$ gas can be supplied from the second reaction gas nozzle 32 into the vacuum container 1.

The valves 36a to 36f and the flow rate adjustment parts 37a to 37f constitute a gas supply system 39.

On the first reaction gas nozzle 31 and the second reaction gas nozzle 32, discharge holes 33 of, for example 0.5 mm in diameter, for discharging the reaction gas to the lower side are arranged at intervals of, for example, 10 mm, in the lengthwise direction of the nozzles and face downward. On the separation gas nozzles 41 and 42, discharge holes 40 of, for example 0.5 mm in diameter, for discharging the separation gas to the lower side are arranged at intervals of, for example, 10 mm, in the lengthwise direction of the nozzles and face downward. The lower regions of the first reaction gas nozzle 31 and the second reaction gas nozzle 32 become a first processing region S1 for causing the BTBAS gas to be adsorbed to the wafer W and a second processing region S2 for causing the $O_3$ gas to be adsorbed to the wafer W, respectively.

The separation gas nozzles 41 and 42 are used for forming isolation regions D for separating the first processing region S1 from the second processing region S2. As shown in FIGS.

2 to 4, the top plate 11 of the vacuum container 1 in the separation regions D is provided with convex portions 4 having a fan-like plan-view shape and protruding downward, wherein the convex portions 4 have a center at the rotation center of the rotary table 2 and circumferentially divide a circle drawn along the vicinity of the inner peripheral wall of the vacuum container 1. Each of the separation gas nozzles 41 and 42 is accommodated in a groove 43 formed at the circumferential center of a circle in each of the convex portions 4 so as to extend in the radial direction of the circle. That is, the distances from the center axis of each of the separation gas nozzles 41 and 42 to both edges (the upstream side edge and the downstream side edge in the rotation direction of the rotary table 2) of each of the fan-like convex portions 4 are the same length.

Accordingly, for example, a flat low ceiling surface (first ceiling surface 44), which is the lower surface of each of the convex portions 4 exists on both sides of each of the separation gas nozzles 41 and 42 in the rotation direction. A ceiling surface (second ceiling surface 45) higher than the first ceiling surface 44 exists on both sides of the first ceiling surface 44 in the rotation direction. The role of the convex portion 4 is to form a separation space which is a narrow space for suppressing the entry of the first reaction gas and the second reaction gas between the convex portion 4 and the rotary table 2, and for preventing the first reaction gas and the second reaction gas from being mixed with each other.

That is, for example, the separation gas nozzle 41 prevents entry of the $O_3$ gas from the upstream side in the rotation direction of the rotary table 2 and also prevents entry of the BTBAS gas from the downstream side in the rotation direction of the rotary table 2. The expression "preventing entry of a gas" means that the $N_2$ gas as a separation gas discharged from the separation gas nozzle 41 is diffused between the first ceiling surface 44 and the surface of the rotary table 2 and, in this example, is blown into the space below the second ceiling surface 45 adjacent to the ceiling surface 44, whereby the gas cannot enter from the adjacent space. The expression "a gas cannot enter" means not only a case where a gas cannot enter at all into the space below the convex portion 4 from the adjacent space, but also a case where although a gas enters somewhat, it is possible to secure a state in which the $O_3$ gas and the BTBAS gas entering from both sides are not mixed in the convex portion 4. As long as such an action is obtained, it is possible to obtain an action of separating the atmosphere of the first processing region S1 from the atmosphere of the second processing region S2, which is the role of the separation region D. Accordingly, the degree of narrowness in the narrow space is set to such a magnitude that the pressure difference between the narrow space (the lower space of the convex portion 4) and the region adjacent to the narrow space (in this example, the space below the second ceiling surface 45) can ensure an action by which "a gas cannot enter." The specific size of the narrow space varies depending on the area of the convex portion 4 and the like. Of course, the gas adsorbed to the wafer W can pass through the separation region D. The gas whose entry is prevented refers to a gas remaining in a gas phase.

Further, as shown in FIG. 4A, the height h from the lower surface of the convex portion 4, i.e., the first ceiling surface 44, to the surface of the rotary table 2 may be, for example, 0.5 mm to 10 mm, preferably about 4 mm in this embodiment. In this case, the rotation number of the rotary table 2 is set to, for example, 1 to 500 rpm. Therefore, in order to secure the separation function of the separation region D, depending on the use range of the rotation number of the rotary table 2, the size of the convex portion 4 or the height h between the lower surface of the convex portion 4 (the first ceiling surface 44) and the lower surface of the rotary table 2 is set based on, for example, experiments or the like. The separation gas is not limited to the $N_2$ gas and may be any gas as long as it does not affect the film forming process. The separation gas may be an inert gas such as, for example, an argon (Ar) gas or the like, or may be a hydrogen ($H_2$) gas or the like.

Moreover, on the lower surface of the top plate 11, a protrusion portion 5 is provided so as to face a region on the outer periphery side of the core portion 21 of the rotary table 2 and so as to extend along the outer periphery of the core portion 21. The protrusion portion 5 is formed continuously with the region of the convex portion 4 existing on the rotation center of the rotary table 2. The lower surface of the protrusion portion 5 is formed at the same height as the lower surface of the convex portion 4 (the first ceiling surface 44). FIGS. 2 and 3 show the top plate 11 horizontally cut at a position lower than the second ceiling surface 45 and higher than the separation gas nozzles 41 and 42. In addition, the protrusion portion 5 and the convex portion 4 are not necessarily integrally formed but may be separate bodies.

Figure 5:
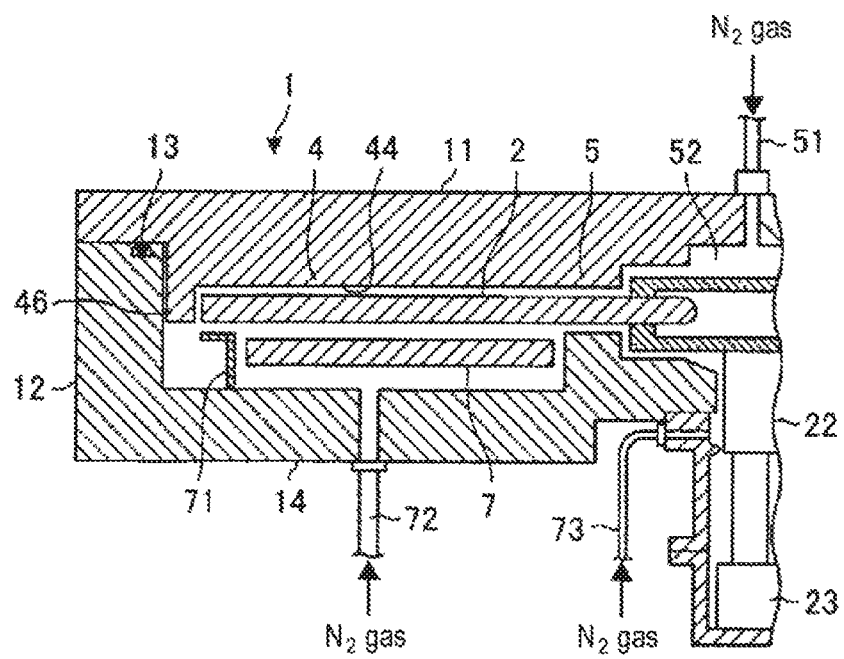
FIG. 5 is a vertical sectional view showing a part of the film forming apparatus of FIG. 1.

The lower surface of the top plate 11 of the vacuum container 1, i.e., the ceiling surface viewed from the wafer mounting regions (recesses 24) of the rotary table 2, includes the first ceiling surface 44 and the second ceiling surface 45 higher than the first ceiling surface 44, which are disposed in the circumferential direction. FIG. 1 shows a vertical cross section of the region where the second ceiling surface 45 is provided, and FIG. 5 shows a vertical cross section of the region where the first ceiling surface 44 is provided. As shown in FIGS. 2 and 5, the peripheral edge portion of the fan-shaped convex portion 4 (the portion on the outer edge side of the vacuum container 1) is bent in an L-like shape so as to face the outer end surface of the rotary table 2, thereby forming a bent portion 46. Since the fan-shaped convex portion 4 is provided on the top plate 11 and can be removed from the container body 12, a slight gap is formed between the outer peripheral surface of the bent portion 46 and the container body 12. Similar to the convex portion 4, the bent portion 46 is provided for the purpose of preventing the reaction gases from entering from both sides and preventing the reaction gases from being mixed. The gap between the inner peripheral surface of the bent portion 46 and the outer end surface of the rotary table 2 and the gap between the outer peripheral surface of the bent portion 46 and the container body 12 are set to the same dimension as the height h of the first ceiling surface 44 with respect to the surface of the rotary table 2.

In the separation region D, the inner peripheral wall of the container body 12 is formed as a vertical surface close to the outer peripheral surface of the bent portion 46 as shown in FIG. 5. On the contrary, as shown in FIG. 1, in the region other than the separation region D, for example, the region from the portion facing the outer end surface of the rotary table 2 to the bottom surface portion 14 is cut in a rectangular vertical cross-sectional shape so as to form an outwardly recessed structure. In the bottom portions of a first exhaust region E1 and a second exhaust region E2 communicating with the first processing region S1 and the second processing region S2 in the recessed region, as shown in FIGS. 1 and 3, a first exhaust port 61 and a second exhaust port 62 are formed, respectively.

As shown in FIG. 1, the first exhaust port 61 is connected to a vacuum pump 64a via an exhaust path 63a on which an exhaust valve 65a is installed. The exhaust valve 65a is, for example, an APC (Auto Pressure Controller) or the like having a variable opening degree, and is configured to be able to adjust the flow rate of the gas flowing through the exhaust path 63a according to the opening degree of the exhaust valve 65a. A pressure detection means 66a composed of a pressure gauge or the like is installed in the exhaust path 63a on the upstream side of the exhaust valve 65a (on the side of the vacuum container 1). The pressure detection means 66a is used for measuring the pressure in the first processing region S1 inside the vacuum container 1 which is the upstream side of the exhaust valve 65a.

Similarly, the second exhaust port 62 is connected to a vacuum pump 64b via the exhaust path 63b on which an exhaust valve 65b is installed. Similar to the exhaust valve 65a, the exhaust valve 65b is formed of an APC or the like and is configured to be able to adjust the flow rate of the gas flowing through the exhaust path 63b according to the opening degree of the exhaust valve 65b. A pressure detection means 66b composed of a pressure gauge or the like is installed in the exhaust path 63b on the upstream side and the downstream side of the exhaust valve 65b. The pressure detection means 66b is used for detecting the pressure in the second processing region S2 inside the vacuum container 1.

As described above, the first exhaust port 61 and the second exhaust port 62 are provided on both sides of the separation region D in the rotation direction in a plan view so that the separation action of the separation region D is reliably performed. More specifically, when viewed from the rotation center of the rotary table 2, the first exhaust port 61 is formed between the first processing region S1 and the separation region D adjacent to the first processing region S1, for example, on the downstream side in the rotation direction. Furthermore, when viewed from the rotation center of the rotary table 2, the second exhaust port 62 is formed between the second processing region S2 and the separation region D adjacent to the second processing region S2, for example, on the downstream side in the rotation direction. Thus, the first exhaust port 61 and the second exhaust port 62 exclusively perform the exhaust of the respective reaction gases (the BTBAS gas and the $O_3$ gas). In this example, the first exhaust port 61 is provided between the first reaction gas nozzle 31 and the extension line of the edge of the separation region D on the side of the first reaction gas nozzle 31, which is adjacent to the first reaction gas nozzle 31 on the downstream side in the rotation direction. Furthermore, the second exhaust port 62 is provided between the second reaction gas nozzle 32 and the extension line of the edge of the separation region D on the side of the second reaction gas nozzle 32, which is adjacent to the second reaction gas nozzle 32 on the downstream side in the rotation direction. That is, the first exhaust port 61 is provided between a straight line L1 passing through the center of the rotary table 2 and the first processing region S1 as indicated by a one-dot chain line in FIG. 3 and a straight line L2 passing through the center of the rotary table 2 and the upstream side edge of the separation region D adjacent to the downstream side of the first processing region S1. The second exhaust port 62 is positioned between a straight line L3 passing through the center of the rotary table 2 and the second processing region S2 as indicated by a two-dot chain line in FIG. 3 and a straight line L4 passing through the center of the rotary table 2 and the upstream side edge of the separation region D adjacent to the downstream side of the second processing region S2.

As shown in FIG. 1, a heater unit 7 serving as a heating means is provided in the space between the rotary table 2 and the bottom surface portion 14 of the vacuum container 1. The heater unit 7 is configured to heat the wafer W on the rotary table 2 to a temperature determined by a process recipe via the rotary table 2. On the lower side in the vicinity of the peripheral edge of the rotary table 2, in order to partition the atmosphere in the region extending from the upper space of the rotary table 2 to the exhaust region E and the atmosphere in the region where the heater unit 7 is located, a cover member 71 is provided so as to surround the heater unit 7 over the entire circumference. The upper edge of the cover member 71 is bent outward in a flange shape. The gap between the bent surface and the lower surface of the rotary table 2 is made small to suppress entry of a gas from the outside to the inside of the cover member 71.

In the region closer to the rotation center than the space where the heater unit 7 is disposed, the bottom surface portion 14 approaches the core portion 21 near the central portion of the lower surface of the rotary table 2 to form a narrow space therebetween. In the through-hole of the rotary shaft 22 penetrating the bottom surface portion 14, the gap between the inner peripheral surface and the rotary shaft 22 is made small. These narrow spaces communicate with the inside of the case body 20. In the case body 20, there is provided a purge gas supply pipe 72 for supplying an $N_2$ gas, which is a purge gas, into the narrow spaces to purge the narrow spaces. In the bottom surface portion 14 of the vacuum container 1, purge gas supply pipes 73 for purging the arrangement space of the heater unit 7 are provided at a plurality of positions in the circumferential direction on the lower side of the heater unit 7.

By providing the purge gas supply pipes 72 and 73 in this way, the space extending from the inside of the case body 20 to the arrangement space of the heater unit 7 is purged with the $N_2$ gas. The purge gas is exhausted from the gap between the rotary table 2 and the cover member 71 to the first exhaust port 61 and the second exhaust port 62 via the exhaust region E. This prevents the BTBAS gas or the $O_3$ gas from flowing from one of the first processing region S1 and the second processing region S2 to the other via the lower side of the rotary table 2. Thus, the purge gas also functions as a separation gas.

Further, a separation gas supply pipe 51 is connected to the central portion of the top plate 11 of the vacuum container 1, so that the $N_2$ gas as a separation gas can be supplied to the space 52 between the top plate 11 and the core portion 21. The separation gas supplied to the space 52 is discharged toward the peripheral edge along the surface of the rotary table 2 on the side of the wafer mounting region via the narrow gap 50 between the protrusion portion 5 and the rotary table 2. Since the space surrounded by the protrusion portion 5 is filled with the separation gas, the reaction gases (the BTBAS gas and the $O_3$ gas) are prevented from being mixed with each other between the first processing region S1 and the second processing region S2 via the central portion of the rotary table 2.

Further, as shown in FIGS. 2 and 3, on the side wall of the vacuum container 1, a transfer port 15 for delivering the wafer W between the external transfer arm 10 and the rotary table 2 is formed. The transfer port 15 is opened and closed by a gate valve (not shown). Under the recess 24 serving as the wafer mounting region of the rotary table 2, an elevating mechanism (not shown) for lift pins that engage the recess 24 to lift the wafer W from the rear surface thereof is provided in the region corresponding to the delivery position on the lower side of the rotary table 2. As a result, the wafer W is delivered to and from the transfer arm 10 at the position facing the transfer port 15.

Further, as shown in FIG. 1, the film forming apparatus is provided with a control part 80 such as a computer or the like for controlling the operation of the entire apparatus. The control part 80 includes a program, a memory and a data processing unit such as a CPU or the like. The program incorporates commands (respective steps) so as to send control signals to the respective parts of the film forming apparatus from the control part 80 to execute various processes (for example, a pressure control method to be described later). The program is stored in a computer-readable storage medium, for example, a storage medium such as a flexible disk, a compact disk, a hard disk, a MO (magneto-optical) disk, a memory card or the like, and is installed in the control part 80.

Figure 6:
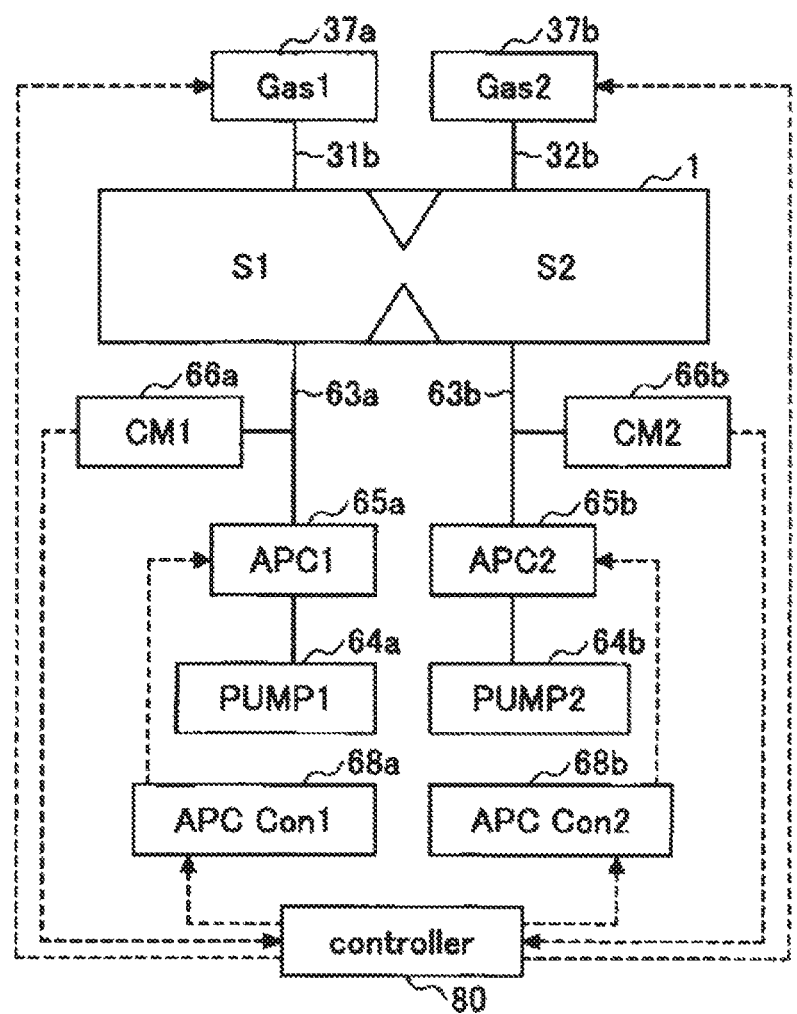
FIG. 6 is a view for explaining a control system of the film forming apparatus of FIG. 1.

Next, a control system according to an embodiment of the present disclosure will be described. FIG. 6 is a view for explaining a control system of the film forming apparatus of FIG. 1. In FIG. 6, the gas lines are indicated by solid lines and the electric control system is indicated by broken lines. Further, in FIG. 6, the flow rate adjustment parts 37a and 37b are indicated by "Gas1" and "Gas2", the vacuum pumps 64a and 64b are indicated by "PUMP1" and "PUMP2", and the exhaust valves 65a and 65b are indicated by "APC1" APC2." Moreover, the pressure detection means 66a and 66b are indicated by "CM1", "CM2", the valve adjustment parts 68a and 68b are indicated by "APC Con1", "APC Con 2", and the control part 80 is labeled as a "controller."

The control part 80 acquires a first pressure and a second pressure detected by the pressure detection means 66a and 66b.

The control part 80 controls the operations of the flow rate adjustment parts 37a and 37b. Specifically, the control part 80 inputs a target flow rate to the flow rate adjustment parts 37a and 37b. The target flow rate may be, for example, a value that changes at a predetermined time cycle (for example, every second).

The control part 80 controls the operations of the valve adjustment parts 68a and 68b. Specifically, the control part 80 inputs a target flow rate and a target pressure to the valve adjustment parts 68a and 68b. The target flow rate and the target pressure may be, for example, values that change at a predetermined time cycle (for example, every second). In addition, the control part 80 inputs the first pressure and the second pressure, which are detected by the pressure detection means 66a and 66b, to the valve adjustment part 68a and 68b, respectively. In addition, the control part 80 sets operation modes of the valve adjustment parts 68a and 68b. More specifically, the operation modes of the valve adjustment parts 68a and 68b are set to an "opening degree priority mode" or a "pressure priority mode." The "opening degree priority mode" is a mode in which the exhaust valves (the exhaust valves 65a and 65b) are controlled to have the opening degrees calculated on the basis of the target flow rate, the target pressure and the learning information indicating the relationship between a flow rate, a pressure and an opening degree. The learning information indicating the relationship between a flow rate, a pressure and an opening degree is prepared for each exhaust valve and each processing region, for example, by preliminary experiments or the like, and is stored in the memory part in advance. The learning information may be, for example, a map indicating the relationship between a flow rate, a pressure and an opening degree. The "pressure priority mode" is a mode in which the opening degrees of the exhaust valves (the exhaust valves 65a and 65b) are controlled on the basis of the pressures (the first pressure and the second pressure) detected by the pressure detection means (the pressure detection means 66a and 66b).

The flow rate adjustment part 37a adjusts the flow rate of the gas flowing through the gas supply pipe 31b. Specifically, the flow rate adjustment part 37a adjusts the flow rate of the gas flowing through the gas supply pipe 31b, so that the flow rate becomes equal to the target flow rate inputted from the control part 80.

The flow rate adjustment part 37b adjusts the flow rate of the gas flowing through the gas supply pipe 32b. Specifically, the flow rate adjustment part 37b adjusts the flow rate of the gas flowing through the gas supply pipe 32b, so that the flow rate becomes equal to the target flow rate inputted from the control part 80.

The valve adjustment part 68a adjusts the opening degree of the exhaust valve 65a. Specifically, in the case of the "opening degree priority mode", the valve adjustment part 68a adjusts the opening degree of the exhaust valve 65a so as to become equal to the opening degree calculated on the basis of the target flow rate and the target pressure inputted from the control part 80 and the learning information indicating the relationship between a flow rate, a pressure and an opening degree. Further, in the case of the "pressure priority mode", the valve adjustment part 68a adjusts the opening degree of the exhaust valve 65a based on the first pressure (actually measured pressure) inputted from the control part 80.

The valve adjustment part 68b adjusts the opening degree of the exhaust valve 65b. Specifically, in the case of the "opening degree priority mode", the valve adjustment part 68b adjusts the opening degree of the exhaust valve 65b so as to become equal to the opening degree calculated on the basis of the target flow rate and the target pressure inputted from the control part 80 and the learning information indicating the relationship between a flow rate, a pressure and an opening degree. Further, in the case of the "pressure priority mode", the valve adjustment part 68b adjusts the opening degree of the exhaust valve 65b based on the second pressure (actually measured pressure) inputted from the control part 80.

Figure 7:
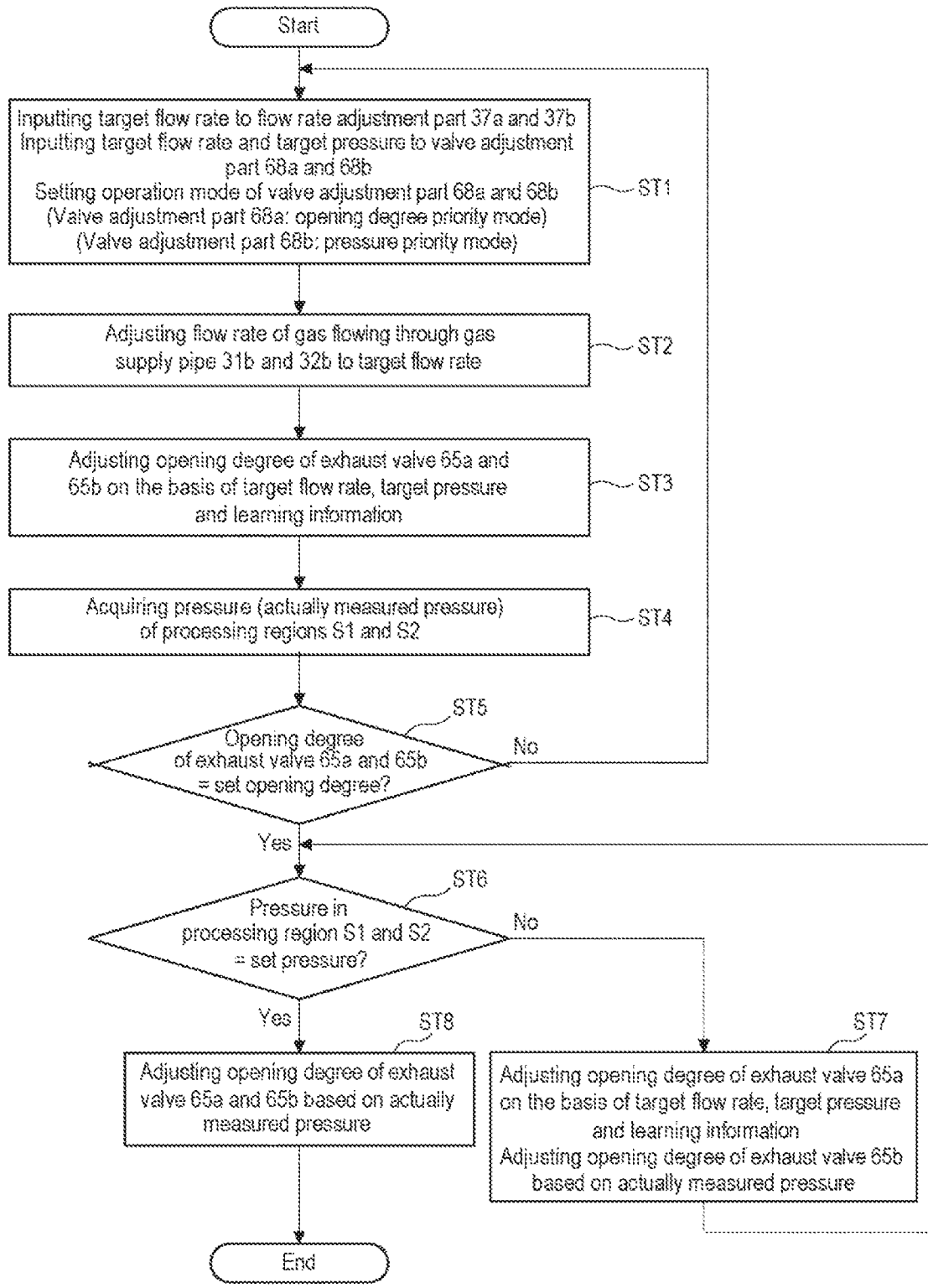
FIG. 7 is a flowchart showing an example of a pressure control method according to a first embodiment.
Figure 8:
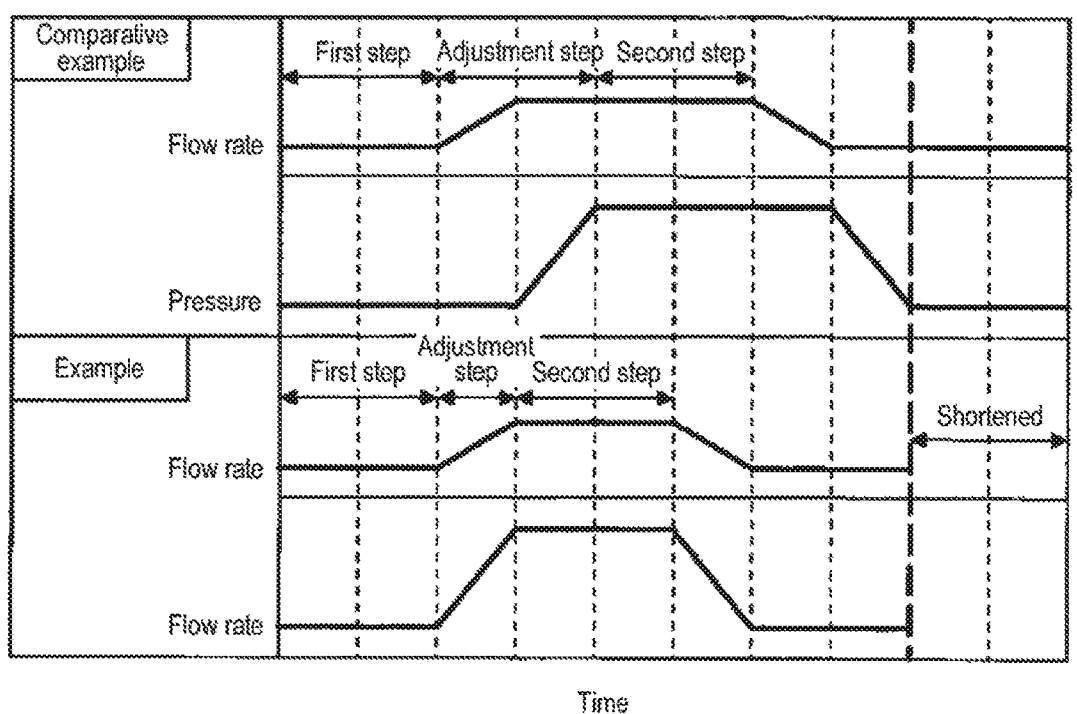
FIG. 8 is a view showing a time-dependent change in a supply flow rate of a gas and a pressure inside a processing container.

Next, a pressure control method according to an embodiment of the present disclosure will be described. Hereinafter, a case where a flow shifts from a first step to a second step in which the gas supply flow rate and the pressure (processing pressure) inside the processing container are different from those of the first step will be described as an example. FIG. 7 is a flowchart showing an example of the pressure control method according to the first embodiment. FIG. 8 is a diagram showing the time-dependent changes in the gas supply flow rate and the pressure inside the processing container.

First, the control part 80 inputs a target flow rate to the flow rate adjustment parts 37a and 37b, and inputs a target flow rate and a target pressure to the valve adjustment parts 68a and 68b (step ST1). The target flow rate and the target pressure are values that change from the set values (the set flow rate and the set pressure) in the first step toward the set values (the set flow rate and the set pressure) in the second step at a predetermined time cycle (for example, every second). In addition, the control part 80 sets the operation modes of the valve adjustment parts 68a and 68b. In the embodiment, the operation mode of the valve adjustment part 68a is set to the "opening degree priority mode", and the operation mode of the valve adjustment part 68b is set to the "pressure priority mode". The operation mode of the valve adjustment part 68a may be set to the "pressure priority mode", and the operation mode of the valve adjustment part 68*b* may be set to the "opening degree priority mode."

Subsequently, the flow rate adjustment parts 37*a* and 37*b* adjust the flow rates of the gases flowing through the gas supply pipes 31*b* and 32*b* so as to become equal to the target flow rate inputted in step ST1 (step ST2).

Subsequently, the valve adjustment parts 68*a* and 68*b* adjust the opening degrees of the exhaust valves 65*a* and 65*b* on the basis of the target flow rate and the target pressure inputted in step ST1 and the learning information indicating the relationship between a flow rate, a pressure and an opening degree (step ST3).

Subsequently, the control part 80 acquires the pressures (actually measured pressures) in the processing regions S1 and S2 (step ST4). Specifically, the control part 80 acquires the first pressure detected by the pressure detection means 66*a* and the second pressure detected by the pressure detection means 66*b*.

Subsequently, the control part 80 determines whether or not the opening degree of the exhaust valves 65*a* and 65*b* coincides with the set opening degree of the second step (step ST5). The set opening degree is an opening degree calculated on the basis of the set flow rate and the set pressure of the second step and the learning information indicating the relationship between a flow rate, a pressure and an opening degree.

If it is determined in step ST5 that the opening degree of the exhaust valves 65*a* and 65*b* does not coincide with the set opening degree of the second step, the flow returns to step ST1. If it is determined in step ST5 that the opening degree of the exhaust valves 65*a* and 65*b* coincides with the set opening degree of the second step, the control part 80 determines whether or not the first pressure and the second pressure acquired in step ST4 coincide with the set pressure of the second step (step ST6).

If it is determined in step ST6 that the first pressure and the second pressure do not coincide with the set pressure of the second step, the valve adjustment parts 68*a* and 68*b* adjust the opening degree of the exhaust valves 65*a* and 65*b* (step ST7). Specifically, the valve adjustment part 68*a* is set to the "opening degree priority mode" in step ST1. Therefore, the valve adjustment part 68*a* adjusts the opening degree of the exhaust valve 65*a* to the opening degree calculated on the basis of the target pressure, the target flow rate and the learning information indicating the relationship between a flow rate, a pressure and an opening degree. On the other hand, the valve adjustment part 68*b* is set to the "pressure priority mode" in step ST1. Therefore, the valve adjustment part 68*b* adjusts the opening degree of the exhaust valve 65*b* so that the second pressure detected by the pressure detection means 66*b* coincides with the set pressure of the second step.

If it is determined in step ST6 that the first pressure and the second pressure coincide with the set pressure of the second step, the control part 80 changes the operation mode of the flow rate adjustment parts 37*a* and 37*b* to the "pressure priority mode" (step ST8), thereby terminating the process.

As described above, the pressure control method according to the first embodiment includes a first adjustment step including steps ST1 to ST5 and a second adjustment step including steps ST6 to ST8. The first adjustment step is a step in which the opening degrees of the of the exhaust valves 65*a* and 65*b* provided in the processing regions S1 and S2 are adjusted on the basis of the target pressure and the target flow rate determined for each of the processing regions S1 and S2 and the learning information indicating the relationship between a flow rate, a pressure and an opening degree. The second adjustment step is a step performed after the first adjustment step, and a step in which the opening degree of the exhaust valve 65*b* provided in the second processing region S2 is adjusted on the basis of the actually measured pressure in one processing region S2 of the first and second processing regions S1 and S2.

As described above, in the pressure control method according to the first embodiment, first, in the first adjustment step, the opening degrees of the exhaust valves 65*a* and 65*b* are adjusted without using an actually measured pressure. Then, in the second adjustment step, the opening degrees of the exhaust valves 65*a* and 65*b* are adjusted using an actually measured pressure. Thus, the pressure balance between the first processing region S1 and the second processing region S2 does not collapse greatly when changing the conditions that accompanies a pressure change. Therefore, when changing the conditions, it is unnecessary to perform a step of adjusting the pressure in advance using an inert gas such as an $N_2$ gas or the like. The pressure can be adjusted with the reaction gas used in the process. As a result, it is possible to shorten the time required for changing the conditions and to improve the productivity.

Further, in the first adjustment step, as described above, simultaneously with the adjustment of the pressure, the flow rates of the gases to be supplied to the processing regions S1 and S2 may also be adjusted so as to become equal to the set flow rates determined for the respective processing regions S and S2. By simultaneously performing the pressure adjustment and the flow rate adjustment, as shown in the lower part of FIG. 8, it is possible to shorten the time required for the adjustment step in which the conditions are changed from the first step to the second step. It is also possible to improve the productivity. The upper part of FIG. 8 shows a case where the flow rate is adjusted when changing the conditions from the first step to the second step and the pressure is adjusted after the flow rate reaches the set flow rate of the second step.

Second Embodiment

Figure 9:
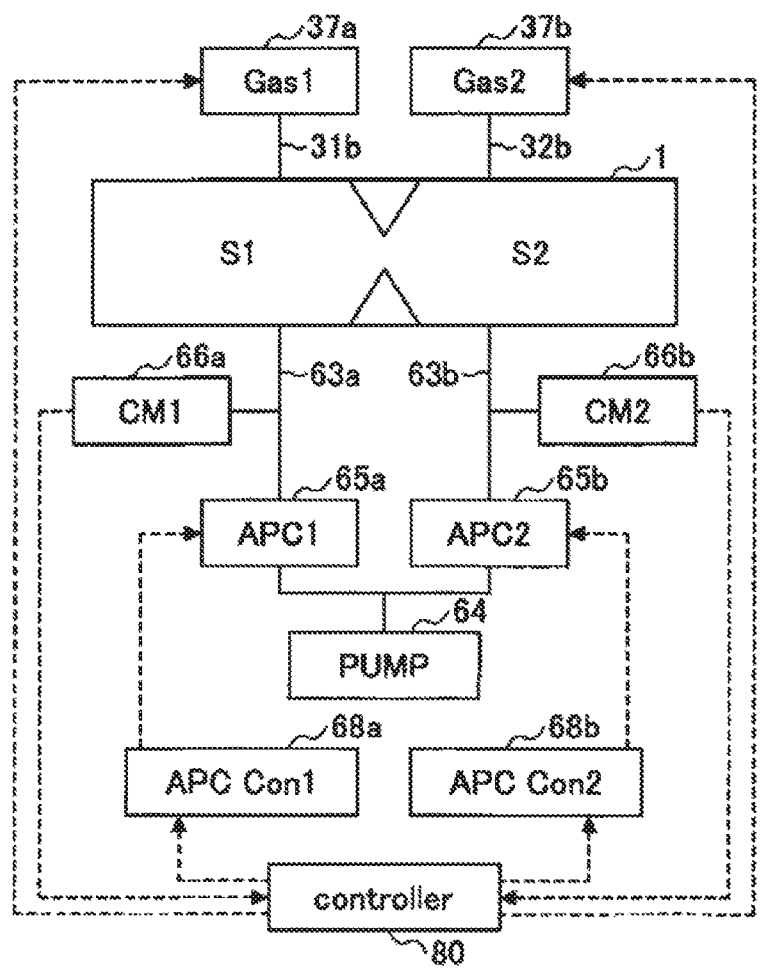
FIG. 9 is a view for explaining a control system of a film forming apparatus according to a second embodiment.

FIG. 9 is a view for explaining a control system of a film forming apparatus according to a second embodiment. In FIG. 9, the gas lines are indicated by solid lines and the electric control system is indicated by broken lines.

As shown in FIG. 9, the film forming apparatus according to the second embodiment differs from the film forming apparatus according to the first embodiment in that the first processing region S1 and the second processing region S2 are evacuated by one vacuum pump 64. Other configurations may be the same as those of the first embodiment. Therefore, in the second embodiment, it is possible to realize the same pressure control method as in the first embodiment.

According to the pressure control method of the second embodiment, the same effects as those of the first embodiment may be obtained.

Third Embodiment

Figure 10:
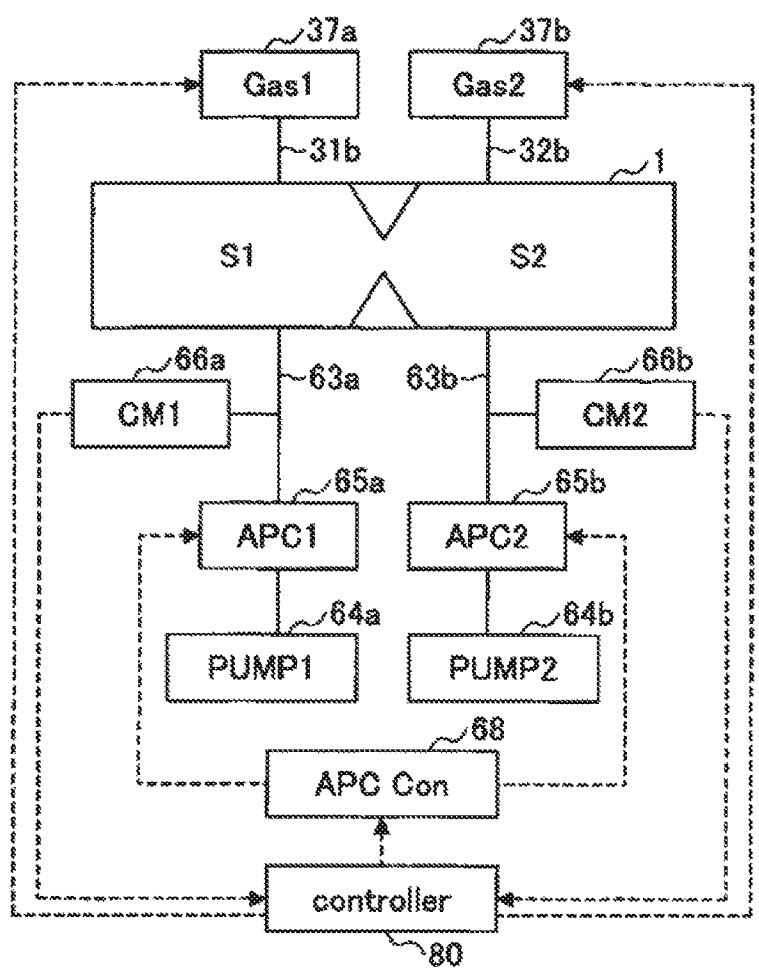
FIG. 10 is a view for explaining a control system of a film forming apparatus according to a third embodiment.

FIG. 10 is a view for explaining a control system of a film forming apparatus according to a third embodiment. In FIG. 10, the gas lines are indicated by solid lines and the electric control system is indicated by broken lines.

As shown in FIG. 10, the film forming apparatus according to the third embodiment differs from the film forming apparatus according to the first embodiment in that the opening degrees of the two exhaust valves 65*a* and 65*b* are adjusted by one valve adjustment part 68. Other configurations may be the same as those of the first embodiment. In the pressure control method according to the third embodiment, one valve adjustment part 68 adjusts the opening degrees of the two exhaust valves 65*a* and 65*b*.

According to the pressure control method of the third embodiment, the same effects as those of the first embodiment may be obtained.

Fourth Embodiment

Figure 11:
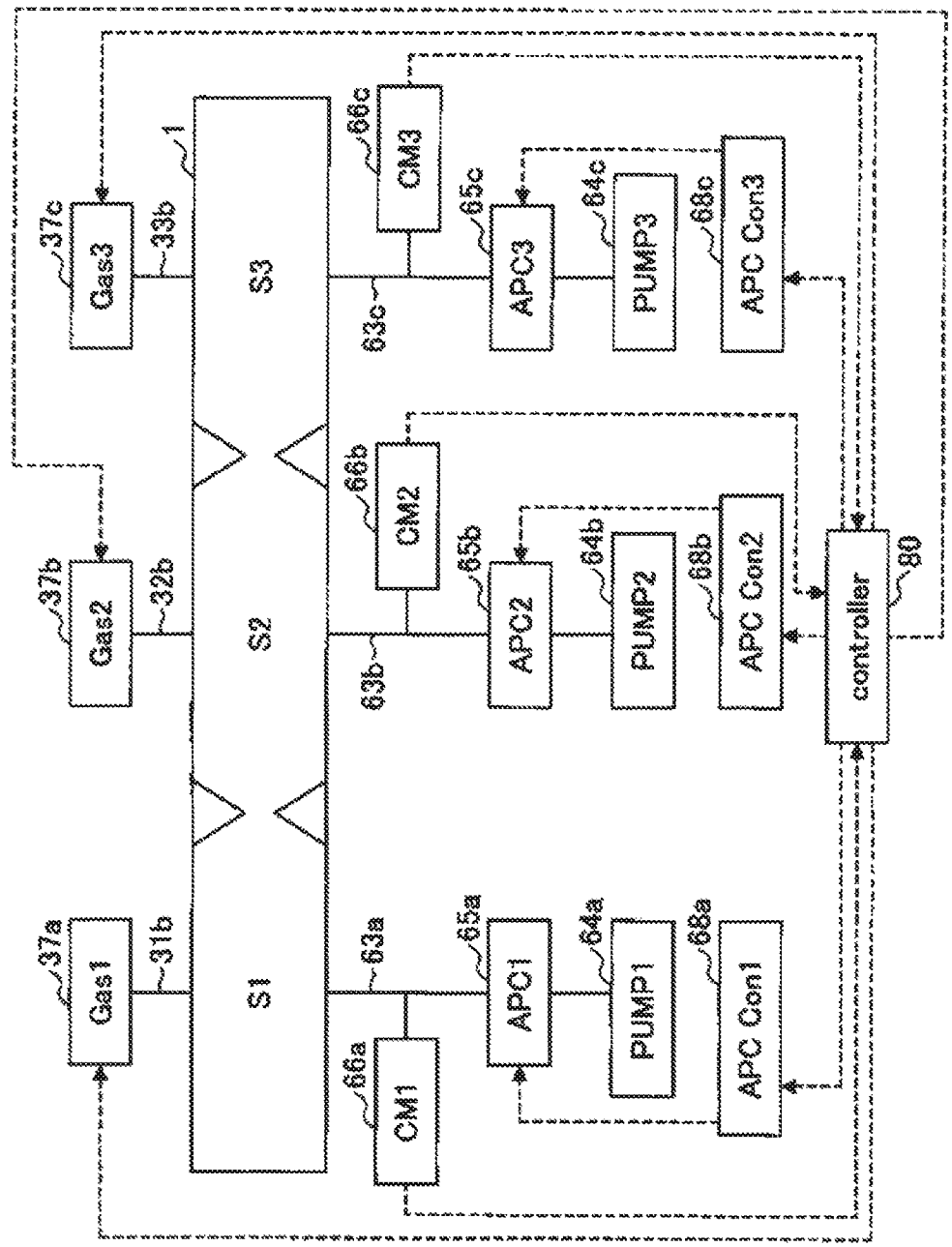
FIG. 11 is a view for explaining a control system of a film forming apparatus according to a fourth embodiment.

FIG. 11 is a view for explaining a control system of a film forming apparatus according to a fourth embodiment. In FIG. 11, the gas lines are indicated by solid lines and the electric control system is indicated by broken lines.

As shown in FIG. 11, the film forming apparatus according to the fourth embodiment differs from the film forming apparatus according to the first embodiment in that three processing regions are incompletely partitioned by the separation regions D to which the separation gas is supplied. Other configurations may be the same as those of the first embodiment.

The control part 80 acquires a first pressure, a second pressure and a third pressure detected by the pressure detection means 66*a*. 66*b* and 66*c*.

The control part 80 controls the operations of the flow rate adjustment parts 37*a*. 37*b* and 37*c*. Specifically, the control part 80 inputs a target flow rate to the flow rate adjustment parts 37*a*, 37*b* and 37*c*. The target flow rate may be, for example, a value which is changed at a predetermined time cycle (for example, every second).

The control part 80 controls the operations of the valve adjustment parts 68*a*, 68*b* and 68*c*. Specifically, the control part 80 inputs a target flow rate and a target pressure to the valve adjustment parts 68*a*, 68*b* and 68*c*. The target flow rate and the target pressure may be, for example, values which are changed at a predetermined time cycle (for example, every second). Further, the control part 80 inputs the first pressure, the second pressure and the third pressure detected by the pressure detection means 66*a*, 66*b* and 66*c* to the valve adjustment parts 68*a*. 68*b* and 68*c*, respectively. Moreover, the control part 80 sets operation modes of the valve adjustment parts 68*a*, 68*b* and 68*c*. More specifically, the operation modes of the valve adjustment parts 68*a*, 68*b* and 68*c* are set to an "opening degree priority mode" or a "pressure priority mode." The "opening degree priority mode" is a mode in which the exhaust valves (the exhaust valves 65*a*, 65*b* and 65*c*) are controlled to have the opening degrees calculated on the basis of the target flow rate, the target pressure and the learning information indicating the relationship between a flow rate, a pressure and an opening degree. The learning information indicating the relationship between a flow rate, a pressure and an opening degree is prepared for each exhaust valve and each processing region, for example, by preliminary experiments or the like, and is stored in the memory part in advance. The learning information may be, for example, a map indicating the relationship between a flow rate, a pressure and an opening degree. The "pressure priority mode" is a mode in which the opening degrees of the exhaust valves (the exhaust valves 65*a*, 65*b* and 65*c*) are controlled on the basis of the pressures (the first pressure, the second pressure and the third pressure) detected by the pressure detection means (the pressure detection means 66*a*. 66*b* and 66*c*).

The flow rate adjustment part 37*a* adjusts the flow rate of the gas flowing through the gas supply pipe 31*b*. Specifically, the flow rate adjustment part 37*a* adjusts the flow rate of the gas flowing through the gas supply pipe 31*b* so as to become equal to the target flow rate inputted from the control part 80.

The flow rate adjustment part 37*b* adjusts the flow rate of the gas flowing through the gas supply pipe 32*b*. Specifically, the flow rate adjustment part 37*b* adjusts the flow rate of the gas flowing through the gas supply pipe 32*b* so as to become equal to the target flow rate inputted from the control part 80.

The flow rate adjustment part 37*c* adjusts the flow rate of the gas flowing through the gas supply pipe 33*b*. Specifically, the flow rate adjustment part 37*c* adjusts the flow rate of the gas flowing through the gas supply pipe 33*b* so as to become equal to the target flow rate inputted from the control part 80.

The valve adjustment part 68*a* adjusts the opening degree of the exhaust valve 65*a*. Specifically, in the case of the "opening degree priority mode", the valve adjustment part 68*a* adjusts the opening degree of the exhaust valve 65*a* so as to become equal to the opening degree calculated on the basis of the target flow rate and the target pressure inputted from the control part 80 and the learning information indicating the relationship between a flow rate, a pressure and an opening degree. Further, in the case of the "pressure priority mode", the valve adjustment part 68*a* adjusts the opening degree of the exhaust valve 65*a* based on the first pressure inputted from the control part 80.

The valve adjustment part 68*b* adjusts the opening degree of the exhaust valve 65*b*. Specifically, in the case of the "opening degree priority mode", the valve adjustment part 68*b* adjusts the opening degree of the exhaust valve 65*b* so as to become equal to the opening degree calculated on the basis of the target flow rate and the target pressure inputted from the control part 80 and the learning information indicating the relationship between a flow rate, a pressure and an opening degree. Further, in the case of the "pressure priority mode", the valve adjustment part 68*b* adjusts the opening degree of the exhaust valve 65*b* based on the second pressure inputted from the control part 80.

The valve adjustment part 68*c* adjusts the opening degree of the exhaust valve 65*c*. Specifically, in the case of the "opening degree priority mode", the valve adjustment part 68*c* adjusts the opening degree of the exhaust valve 65*c* so as to become equal to the opening degree calculated on the basis of the target flow rate and the target pressure inputted from the control part 80 and the learning information indicating the relationship between a flow rate, a pressure and an opening degree. Further, in the case of the "pressure priority mode", the valve adjustment part 68*c* adjusts the opening degree of the exhaust valve 65*c* based on the third pressure inputted from the control part 80.

In the pressure control method according to the fourth embodiment, in step ST1 of the first embodiment, the operation mode of any one of the valve adjustment parts 68*a*, 68*b* and 68*c* is set to the "pressure priority mode". Further, the operation mode of the remaining two of the valve adjustment parts 68*a*, 68*b* and 68*c* is set to the "opening degree priority mode." Other steps may be the same as those of the first embodiment.

According to the pressure control method of the fourth embodiment, the same effects as those of the first embodiment may be obtained.

While the modes for carrying out the present disclosure have been described above, the above contents are not intended to limit the contents of the present disclosure. Various modifications and improvements may be made within the scope of the present disclosure.

In each of the above embodiments, the case where two or three processing regions are incompletely partitioned by the separation region to which the separation gas is supplied has been described as an example. However, the present disclosure is not limited thereto. The number of processing regions may be, for example, four or more.

In each of the above embodiments, the case where a plurality of processing regions is partitioned by the separation region to which the separation gas is supplied has been described as an example. However, the present disclosure is not limited thereto. The processing regions may be incompletely partitioned by other methods.

According to the present disclosure in some embodiments, it is possible to improve productivity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A pressure control method in a film forming apparatus having a plurality of incompletely partitioned processing regions in one vacuum container, comprising:

a first adjustment step of adjusting an opening degree of an exhaust valve provided in each of the processing regions, on the basis of a target pressure and a target flow rate determined for each of the processing regions and learning information indicating a relationship between a flow rate, a pressure and an opening degree; and a second adjustment step of, after the first adjustment step, adjusting an opening degree of the exhaust valve provided in one of the processing regions, on the basis of a detected pressure in the one of the processing regions, while adjusting opening degrees of the exhaust valves provided in remaining processing regions other than the one of the processing regions, on the basis of the target pressure, the target flow rate and the learning information.

2. The method of claim 1, wherein the target pressure and the target flow rate are values changed at a predetermined time cycle, and the first adjustment step is a step of adjusting the opening degree of the exhaust valve at the predetermined time cycle.

3. The method of claim 2, wherein the first adjustment step and the second adjustment step are steps performed when a first step is shifted to a second step different in flow rate and pressure conditions from the first step, and the target pressure and the target flow rate are values changed from a set pressure and a set flow rate of the first step toward a set pressure and a set flow rate of the second step.

4. The method of claim 3, wherein after the opening degree of the exhaust valve has reached a set opening degree of the second step in the first adjustment step, the second adjustment step is executed.

5. The method of claim 2, wherein the predetermined time cycle is every second.

6. The method of claim 1, wherein in the first adjustment step, the flow rate of a gas to be supplied to the processing regions is further adjusted so as to become equal to the target flow rate determined for each of the processing regions.

7. The method of claim 1, wherein the processing regions are incompletely partitioned by a separation region to which a separation gas is supplied.

8. The method of claim 1, wherein the processing regions comprise two processing regions.

* * * * *